United States Patent [19]

Kessler

[11] Patent Number: 5,515,683
[45] Date of Patent: May 14, 1996

[54] THERMOELECTRIC HEATING OR COOLING DEVICE

[75] Inventor: Rolf Kessler, Merzhausen, Germany

[73] Assignee: Litef GmbH, Freiburg im Breisgau, Germany

[21] Appl. No.: 406,891

[22] PCT Filed: Sep. 22, 1993

[86] PCT No.: PCT/EP93/02571

§ 371 Date: Mar. 21, 1995

§ 102(e) Date: Mar. 21, 1995

[87] PCT Pub. No.: WO94/07094

PCT Pub. Date: Mar. 31, 1994

[30] Foreign Application Priority Data

Sep. 22, 1992 [DE] Germany .................. 42 31 702.9

[51] Int. Cl.⁶ ...................................... F25B 21/02
[52] U.S. Cl. .................. 62/3.7; 62/3.3; 62/3.6; 62/324.1
[58] Field of Search .............. 62/3.2, 3.3, 3.7, 62/3.6, 159, 160, 324.1, 324.2

[56] References Cited

U.S. PATENT DOCUMENTS

| | | | |
|---|---|---|---|
| 2,978,875 | 4/1961 | Lackey et al. | 62/3 |
| 2,998,707 | 9/1961 | Meess et al. | 62/3 |
| 3,088,288 | 5/1963 | Elfving | 62/3 |
| 3,091,939 | 6/1963 | Baude | 62/3 |
| 3,125,860 | 3/1964 | Reich | 62/3.7 |
| 3,195,344 | 7/1965 | Francisco | 62/3.7 |
| 3,934,758 | 1/1976 | Kipp | 222/108 |
| 4,671,070 | 6/1987 | Rudick | 62/3 |
| 4,833,889 | 5/1989 | Harwell et al. | 62/3.2 |

FOREIGN PATENT DOCUMENTS

| | | |
|---|---|---|
| 49626 | 8/1966 | German Dem. Rep. . |
| 1817058 | 5/1991 | Germany . |
| 2241378 | 8/1991 | United Kingdom . |

*Primary Examiner*—John M. Sollecito
*Attorney, Agent, or Firm*—Elliott N. Kramsky

[57] ABSTRACT

A thermoelectric heating and cooling chamber is characterized by a large adjustable temperature range. A layer arrangement of plate-shaped Peltier elements includes a first number of lower power Peltier elements that form a first, inner heating/cooling area and a second number of higher power Peltier elements that form an outer heating/cooling area. The two heating/cooling areas are separated by an overlapping intermediate plate of thermally-insulative material such as stress-free cast aluminum. To avoid overheating of the inner layer of the lower power Peltier elements during heating operation, either the cascade arrangement of the higher power Peltier elements is bypassed by a bypass diode polarized so that the electrically bypassed higher power Peltier elements remain currentless during heating operation, or a means limits current through the higher power Peltier elements as a function of a permissible temperature limit on the hot side of the lower power Peltier elements.

4 Claims, 5 Drawing Sheets

Fig. 3
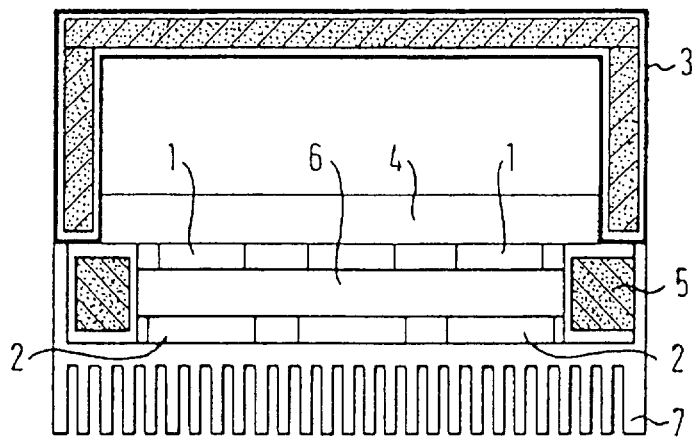
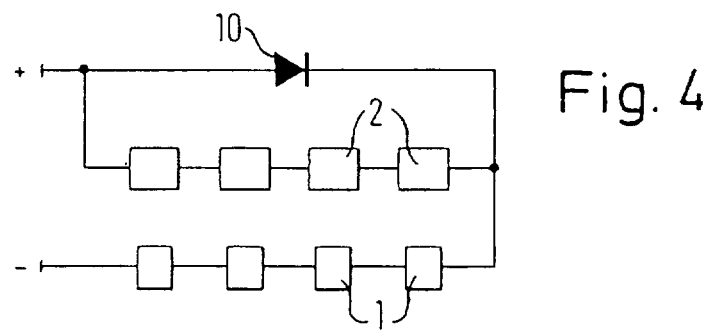
Fig. 4
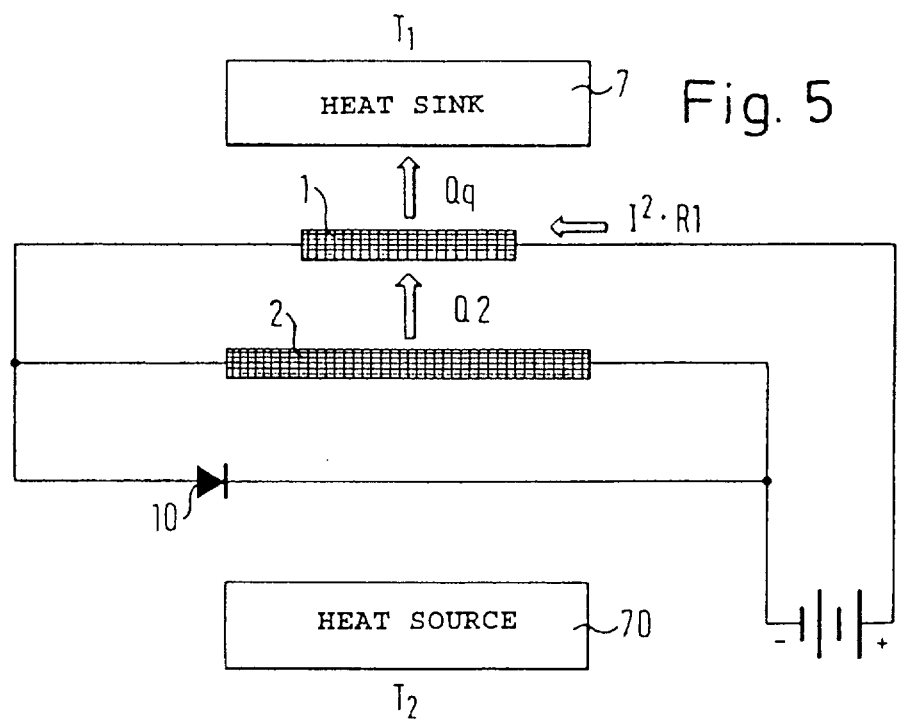
Fig. 5

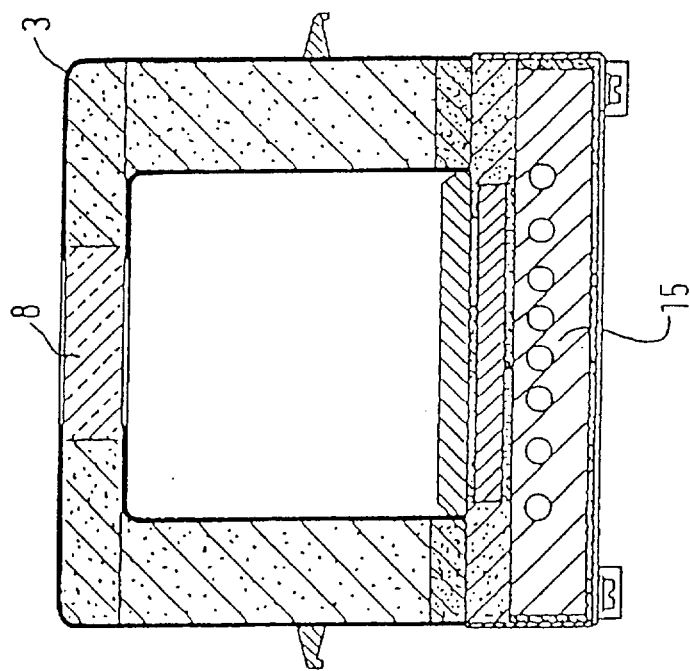
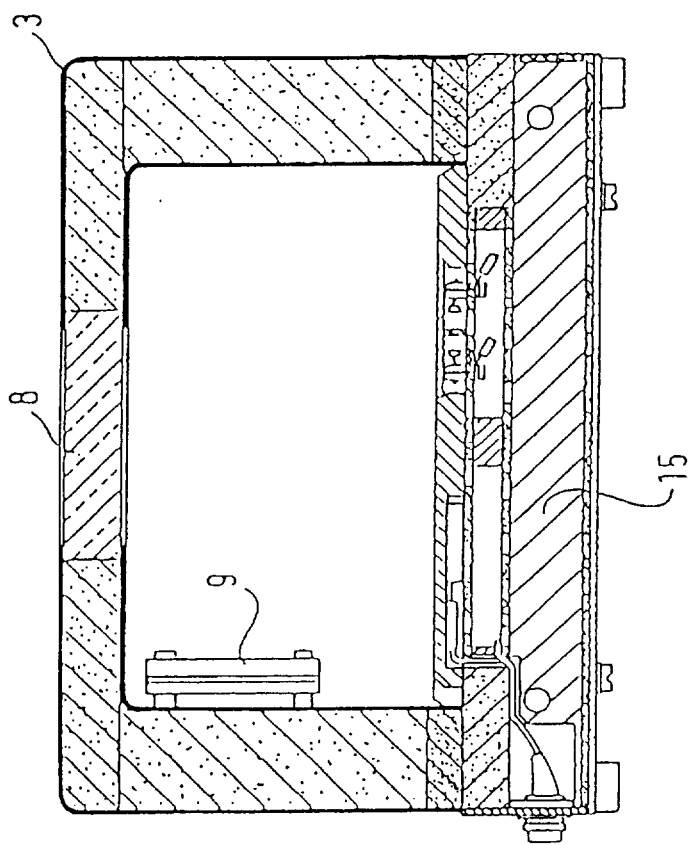

THERMOELECTRIC HEATING OR COOLING DEVICE

BACKGROUND

1. Field of the Invention

The present invention relates to thermoelectric heating and cooling devices. More particularly, the invention pertains to apparatus for overcoming thermal limitations in heating and cooling devices that utilize arrangements of Peltier elements of higher and lower power levels.

2. Description of the Prior Art

It is known that refrigerators equipped with Peltier modules are capable of also operating in the opposite sense. That is, they can also provide a heat chamber, provided that they are surrounded by a housing. In comparison with compressor devices, such refrigerators possess the great advantage that they can be electronically controlled very accurately to attain a constancy of temperature that cannot be achieved by other refrigerating techniques. Peltier heating/cooling chambers of the prior art have a disadvantage in that the adjustable temperature range is very limited and/or the outlay for the power loss "to be pumped away" is too great. The plate-shaped Peltier elements, generally connected in a cascade arrangement, cannot then be adequately protected against overheating (in particular at the edge zones). This applies both to Peltier cascades in one plane (cf. British patent application GB-A-2 241 378) and, to a greater extent, to pyramidal arrangements of a plurality of Peltier cascades (cf. DD-A-0 049 626 and U.S. patent Ser. No. 4,833,889).

The solutions disclosed by the above-cited patent publications permit only limited heating operation of the cascade arrangement of Peltier elements. This is due to the fact that overheating of a portion of the Peltier elements can easily occur. Such overheating gives rise to other disadvantages. For one, as a result of a restricted heating operation, rapid temperature changes to an upper limit are neither permissible or possible. Secondly, greater electric power is required in heating operation. On the one hand rapid wear results from soiling of the semiconductor material and, on the other hand, material stresses result from greater expansions.

SUMMARY AND OBJECTS OF THE INVENTION

It is therefore an object of the invention to provide a thermoelectrically operated heating and cooling unit, in particular a heating and cooling chamber with corresponding heat insulation, that can be operated over a significantly greater temperature range.

Another object of the invention is to achieve the foregoing object with a device in which the outlay for power dissipation loss is not unacceptably large.

The present invention addresses the foregoing by providing an improvement in a thermoelectric device of the type that includes a plurality of Peltier elements in the region of a base area that are connected one behind the other in cascade arrangement and distributed in a heating and cooling area. Such device further includes a heat dissipating means located on an outer surface. The Peltier elements are subdivided into two groups of different power stages and arranged into two mutually parallel layers so that the Peltier elements of lower power form a first, inner heating and cooling area and the Peltier elements of higher power form a second, outer heating and cooling area. The Peltier elements of higher power are covered by the heat-dissipating means.

The improvement provided by the invention resides in the thermoelectric device being installed within a heating/cooling chamber with heat insulation. In addition, at least one of the Peltier elements of highest power is electrically bypassed by means of a bypass diode polarized so that, during heating operation, no electric current flows through a bypassed Peltier element.

The preceding and other features and advantages of the present invention will become further apparent from the detailed description that follows. Such written description is accompanied by a set of drawing figures. Numerals of the figures, corresponding to those of the written text, point to the features of the invention. Like numerals refer to like features throughout both the written description and the drawing figures.

BRIEF DESCRIPTION OF THE DRAWINGS

FIG. 3 is a sectional view of the basic structure of a thermoelectric heating and cooling chamber in accordance with the invention;

FIG. 4 is a view of a circuit arrangement of Peltier elements and bypass diode according to the invention for avoiding overheating of the lower power Peltier elements;

FIG. 5 is a schematic diagram of a two-layered cascade arrangement of Peltier elements of different powers for illustrating the mode of operation of a bypass diode for a portion of the Peltier elements;

FIGS. 12 and 13 are longitudinal and transverse sectional views, respectively, of a second tested embodiment of a Peltier heating and cooling chamber in accordance with the invention.

DETAILED DESCRIPTION

As is well known to those skilled in the art, heat can be transported quite easily by means of Peltier elements. Such elements in principle comprise a series arrangement of thermocouples that are activated by an external direct current. Comparatively good cooling and heating effects can be accomplished by utilizing a well-designed spatial arrangement and employing specially-doped semiconductor materials. In the case of Peltier elements of the type discussed herein, there always exists one side that absorbs heat ("cold side") and another that gives off heat ("hot side"). When two spatial arrangements are stacked one above the other, a greater temperature difference is achieved with a comparatively compact design.

In the case of cooling, the larger element(s) must both hand pump the actual useful heat output away to produce the desired temperature difference and the Joulean heat output ($I^2 \times R$) of the element (elements) lying thereabove. For this reason, "pyramidal" arrangements are often chosen, such as that disclosed, for example, in U.S. Pat. No. 4,833,889, supra.

Figure 1:
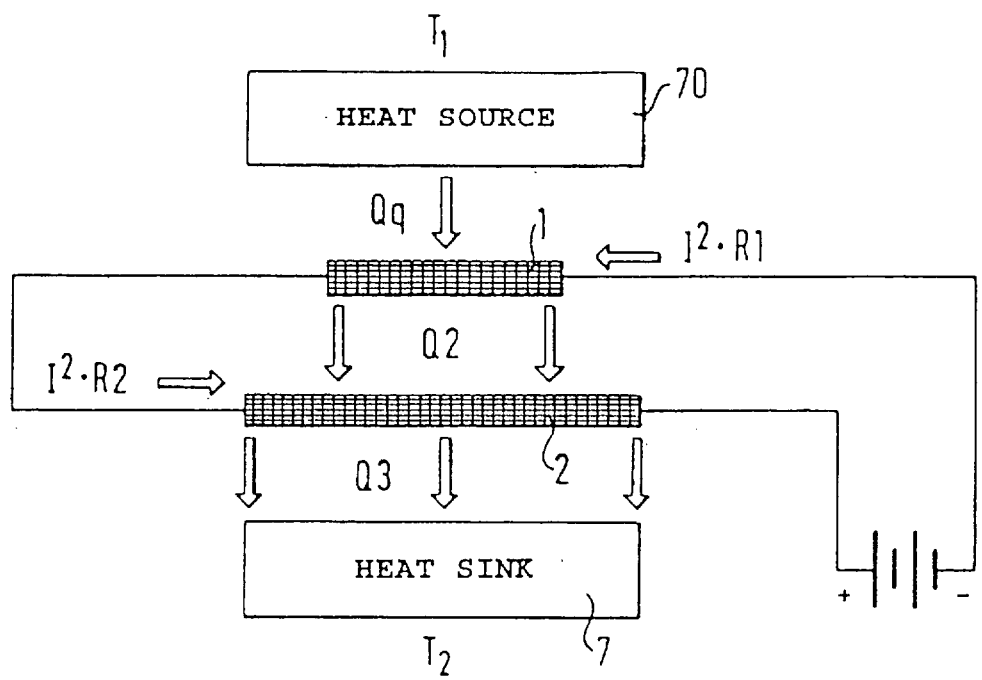
FIG. 1 is a schematic diagram of a two-layered cascade arrangement of Peltier elements illustrating heat balance during cooling operation.

The heat balance of such a pyramidal cascade arrangement (i.e. heat flows occurring during heating or cooling operation) are described below, initially with respect to FIGS. 1 and 2. FIG. 1 is a schematic diagram of a two-layered cascade arrangement of Peltier elements illustrating the heat balance during cooling operation. Referring to FIG. 1, the following applies: Element 1 must pump away the amount of heat originating from the heat source 70 (temperature $T_1$) or $Q1=Qq$. Element 2 must pump away not only Qq but also the heat loss of the element 1. Thus, $$Q2 = I^2 \cdot R1 + Qq$$

Finally, the heat sink 7 must also absorb the heat loss of the element 2. The following consequently applies:

$$Q3 = I^2 \cdot R2 + I^2 \cdot R1 + Qq$$

The above-specified relationships follow from the following assumption:

$$Q1 \ll Q2 \text{ or } T_1 \ll T_2.$$

The system of FIG. 1 is correctly dimensioned under the given assumptions and for the specified heat flows.

Figure 2:
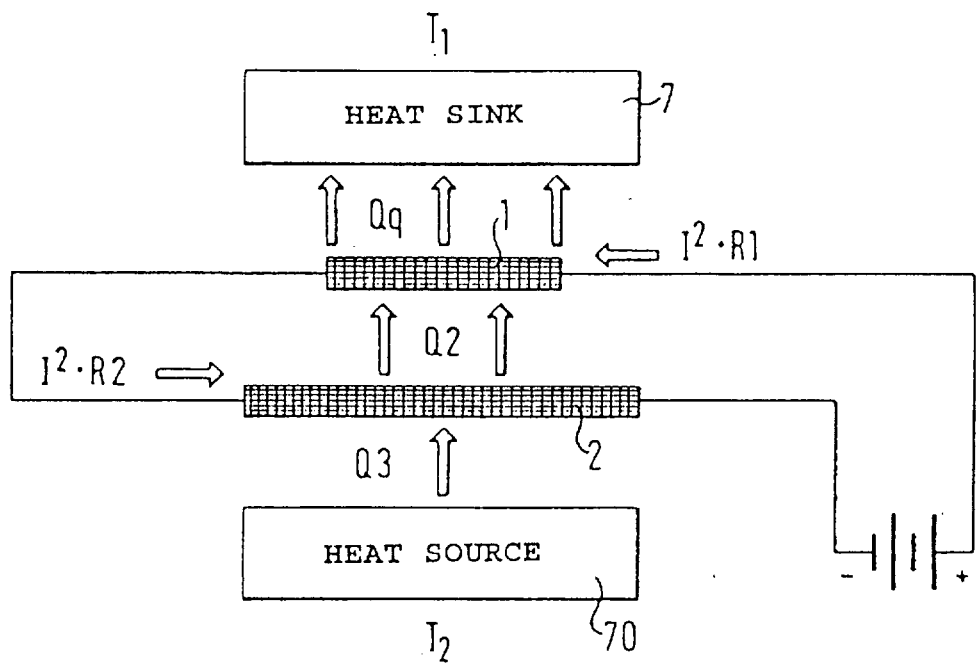
FIG. 2 is a schematic diagram of a two-layered cascade arrangement corresponding to that of FIG. 1 illustrating heat balance during heating.

FIG. 2 is a schematic diagram of a two-layered cascade arrangement corresponding to the preceding figure for illustrating the heat balance during heating operation. Referring to FIG. 2, the following applies: The element 1 must pump away $Q2=I^2 \cdot R2+Q3$. Element 2 must pump away the amount of heat originating from the heat source 70 (temperature $T_2$) or $Q3$.

The heat sink 7 must absorb the following:

$$Qq = I^2 \cdot R1 + I^2 \cdot R2 + Q3.$$

The following assumption applies:

$$Q2 \ll Q3; T_1 \ll T_2.$$

It is evident from the above that the smaller Peltier element 1 has to dissipate more than the larger Peltier element 2.

If the heat flows that the individual elements have to pump away are now considered, it is evident that there is a bottleneck, i.e. a heat build-up, in the heating operation at element 1.

The following applies for the element 1:
Case 1 (FIG. 1): heat to be dissipated ("to be pumped away")=Qq
case 2 (FIG. 2): heat to be dissipated ("to be pumped away")=I2.R2+Q3.

The additional element that causes difficulties through the element 1 during heating is the Joulean output ($I^2 \cdot R2$) of the larger Peltier element 2. As a rule, the heat pumping capacity of the smaller element 1 (or smaller elements) is insufficient to simultaneously pump away this additional element (i.e. the Joulean output). As a result, a heat build-up occurs during heating. This heat build-up is avoided in the claimed invention, as explained infra.

The present invention addresses the problem of the heat build-up by current limitation arrangements for the Peltier elements of lower power. Such arrangements, discussed below, may advantageously comprise a bypass diode that electrically bypasses at least one of the Peltier elements of higher power and is polarized so that, during heating operation, the relevant Peltier element or elements of higher power remain currentless.

The bypass diode may either electrically bypass all the Peltier elements of higher power connected in cascade or it may be assigned individually to at least one of the Peltier elements of higher power. In the latter case, the individual bypass diodes may be integrated into the associated Peltier element.

The current-limiting means may also comprise a temperature sensor that controls a current regulator for the Peltier elements of higher power.

Another possibility for current limitation in the Peltier elements of higher power is bypassing by means of an NTC thermistor that senses the temperature on the hot side of the Peltier elements of low power. The operating point of the thermistor is chosen such that, upon reaching a limiting temperature, the NTC thermistor resistance becomes so small that the current through the Peltier elements of higher power is reduced to a level at which overheating of the Peltier elements of lower power is prevented.

The first and second group of plate-shaped Peltier elements may, in each case, be fitted in depressions of a frame-like receptacle having good heat insulation.

In order to avoid overheating of the Peltier cascade arrangement (and, in particular, temperature peaks in the edge zones of the Peltier elements) during heating operation, the invention provides that at least some of the second group of Peltier elements of higher power are either current-regulated or electrically bypassed by a bypass diode polarized so that, during heating operation, the relevant Peltier element or elements remain(s) current-less. Furthermore in order to reduce temperature peaks in the edge zones, it is additionally foreseen to design the surface area of the intermediate plate larger than the total surface area taken up by the two area arrangements of Peltier elements so that the intermediate plate overlaps all the Peltier elements at the edges.

FIG. 3 is a sectional view of the basic structure of a thermoelectric heating and cooling chamber in accordance with the invention. The basic sectional representation includes an insulating shroud 3 which encloses a receiving plate 4 in a sealed manner on all sides and an interior space of, typically, 3 to 30 liters or larger, to be cooled or heated to very accurate temperature constancy with a good heat insulating effect. Below the receiving plate 4 is a first inner layer arrangement of spatial Peltier elements 1 of comparatively lower power exactly fitted in preshaped depressions of a frame plate with good heat insulation. The Peltier elements are electrically connected in a known way in cascade arrangement. The inner layer of the first number of Peltier elements 1 of low power is separated by an intermediate plate 6 of stress-free cast aluminum from a second number of spatial Peltier elements 2 of higher power. The second number of spatial Peltier elements 2 is likewise fitted exactly into corresponding depressions of another frame plate of good thermal insulation. The Peltier elements 2 of higher power are also electrically connected in cascade and, moreover, are connected in cascade arrangement to the first number of Peltier elements 1 of lower power. A peripheral, strongly insulating seal is indicated by the reference symbol 5. Attached below the layer structure of the first number of the Peltier elements 1, the intermediate plate 6, and the second number of Peltier elements 2, is a heat sink 7 for transporting away the heat loss.

One layer, for example the inner layer 1, may comprise up to ten (10) Peltier elements. To avoid temperature peaks, particularly in the regions of the edge zones of the Peltier elements 1 or 2, each Peltier element layer is in closely adapted contact with the common intermediate plate to approximately equalize the heat resistances for each element. The intermediate plate 6 overlaps all the Peltier elements at the edges by at least 1 cm. Overheating in the edge zones of the Peltier elements 1 or 2 is thus effectively prevented.

The overheating problem explained above for the lower power Peltier elements 1 can be avoided by the invention which reduces or entirely eliminates the Joulean heat of the larger elements 2 during heating operation. The reduction of Joulean heat during heating can be accomplished in a number of ways in accordance with the invention. This may include one or more bypass diodes or, alternatively, limiting current through the element(s) 2.

FIG. 4 is a view of a circuit arrangement of Peltier elements and a bypass diode for the cascade connection of Peltier elements 1 of lower power to Peltier elements 2 of higher power. If the receiving plate 4 is cooled, the Peltier elements 1 of lower power transport heat from the receiving plate 4 into the intermediate plate 6. The Peltier elements 2 of higher power must dissipate part of their own power loss and the power loss of the Peltier elements 1 of lower power, as explained above. For this reason, the Peltier elements 2 of higher power located closer to the heat sink 7 are of larger surface area.

During heating, heat flows in the opposite direction, as explained above. This poses risk of an impermissibly large heat build-up on the intermediate plate 6 resulting from the inability the Peltier elements 1 of lower power to transport the significantly higher power loss of the higher power Peltier elements 2 away. For this reason, in accordance with a first basic embodiment of the invention as illustrated in FIG. 4, a power diode 10 is connected as a bypass in parallel with the circuit of the Peltier elements 2. Depending upon the desired temperature range and other design parameters, it may be adequate to provide only some of the higher power Peltier elements 2 with a parallel bypass diode. This type of connection results in the operation of only lower power Peltier elements 1 during the heating phase and provides safe operation at higher temperatures.

FIG. 5 is a schematic diagram of a two-layered cascade arrangement of Peltier elements of different powers illustrating the mode of operation of a bypass diode for a portion of the Peltier elements. As FIGS. 4 and 5 show, the simplest method is the parallel connection of a power diode 10 with respect to the elements 2 so that, during heating operation, the diode 10 operates in the forward direction conducting the Peltier current past the elements 2.

The heat flow with a bypass diode during heating operation can be observed in FIG. 5. Under the assumption that T1>>T2, the following apply: the element 1 must pump away Q2; the element 2 must pump away 0; and the heat sink 7 must absorb Qq+Q2+$I^2$.R1.

It is evident that only the Joulean heat $I^2$.R1 and the useful pump output Q2 of element 1 is dissipated into the heat sink 7.

The Peltier element 1 now operates in the normal, permissible operating state.

Figure 6:
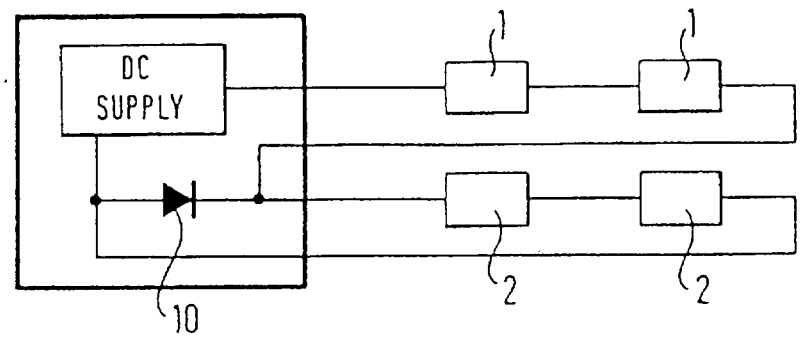
FIGS. 6 to 8 illustrate various alternatives for arranging and connecting one or more diodes for bypassing some Peltier elements.
Figure 7:
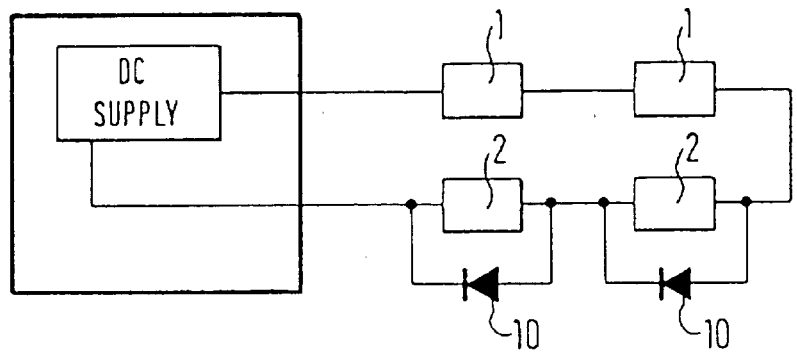
Figure 8:
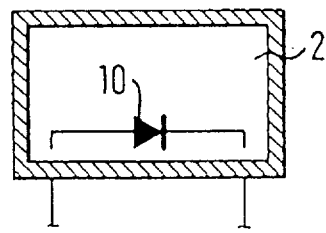

FIGS. 6 through 8 illustrate various alternatives for arranging and connecting one or more diodes to bypass Peltier elements. The bypass diode 10 can be located variously, depending upon the application. Possible locations include:

a) at the current source (as in FIG. 6);
b) externally at the individual Peltier elements 2 (as in FIG. 7);
c) integrated in the individual or all the Peltier elements 2 (as in FIG. 8).

Referring first to the arrangement of FIG. 6 ("a" above), only a single bypass diode 10 of higher power is required. The wiring outlay is nevertheless comparatively larger. A further advantage is, however, that one is independent of temperature influences at the Peltier elements 2.

In the arrangement of FIG. 7 ("b" above), as many bypass diodes 10 are required as there are Peltier elements in the relevant cascade. A certain dependence exists on the temperature influence of the relevant Peltier element. It is particularly advantageous that the wiring outlay between the arrangement of the Peltier elements 2 and the power source is small.

The arrangement of FIG. 8 ("c" above), is the solution of most interest technically and regarding wiring outlay. The type of installation is chosen so that the diode 10 operates reliably with no apparent disadvantages even at higher temperatures.

Figure 9:
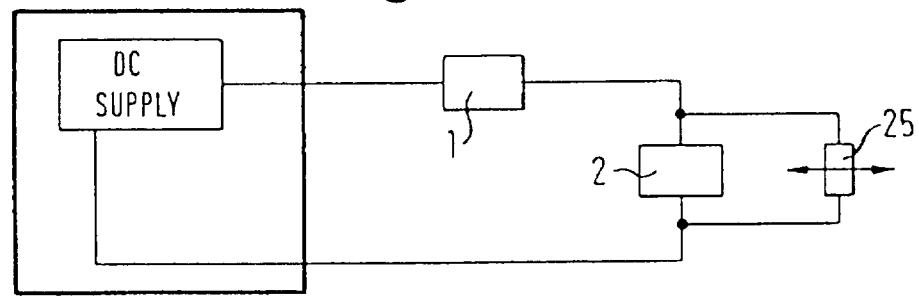
FIG. 9 illustrates a further embodiment of the invention wherein some Peltier elements are bypassed by means of an NTC thermistor.
Figure 10:
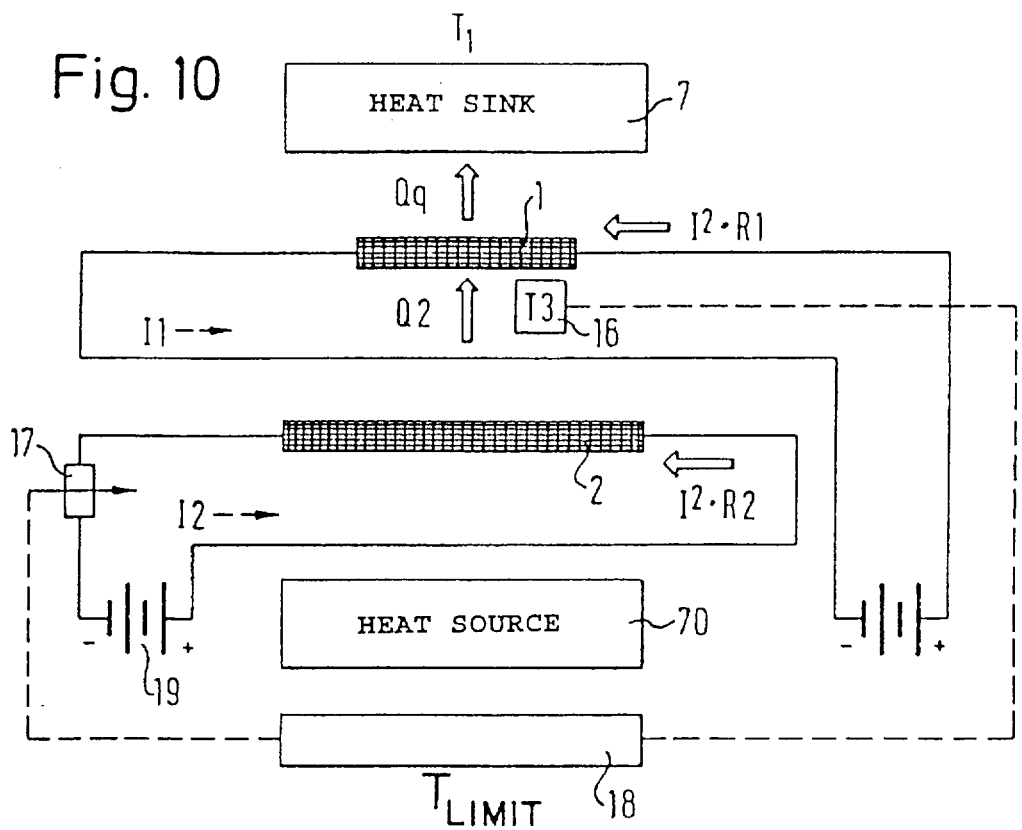
FIG. 10 is a schematic diagram of a further embodiment of the invention for current limitation in a portion of the Peltier elements of a multi-layered cascade arrangement during heating operation.

The integration of the bypass diode 10 can occur during production of the Peltier element itself and is particularly appropriate if it is intended to offer an arrangement of Peltier elements in cascade (pyramid) form that can also be used for heating purposes. FIGS. 9 and 10 illustrate alternative basic embodiments of the invention in which the current through the Peltier elements 2 of higher power is regulated or set as a function of the hot-side temperature of the Peltier elements 1 of lower power.

In this embodiment of the invention, a possible disadvantage of embodiments that include a bypass diode—the Peltier elements 2 of higher power no longer operate together with the elements 1 before the excessive temperature increase has brought about a critical situation for the Peltier elements 1—is avoided. If, for example, one wishes to make the temperature T1 increase very quickly, it will be of interest that the Peltier elements 2 operate as well for as long as possible.

A first possible way of meeting the above requirement is to limit the current source for the Peltier elements 2 as function of the hot-side temperature T3 of the Peltier elements 1 so that the permissible maximum temperature value during heating operation is not exceeded. The basic mode of such operation is illustrated by the embodiment of FIG. 10.

A temperature sensor 16 measures the temperature T3 on the hot side of the Peltier elements 1 and controls a current limiter 18 of known design by means of an adjusting element 17. As a result, the current I2 through the Peltier elements 2 and, thus, the temperature T3, always remain lower than a predeterminable limiting temperature $T_{limit}$ ($T3<T_{limit}$).

Operating the two groups of Peltier elements 1 and 2 requires two power supplies. In return, however, the two different types of Peltier elements can be operated individually at their respective optimum operating points.

A second, simpler possibility is illustrated by the basic representation of FIG. 9 which requires only a single power supply. An NTC thermistor 25 is installed in such a way that it reliably measures the temperature T3 at the hot side of the Peltier elements 1. The operating point of the NTC thermistor 25 is chosen so that, upon reaching the limiting temperature, its resistance becomes sufficiently small so that the current through the Peltier elements 2 will reach a magnitude that no longer results in overheating of the Peltier elements 1.

Figure 11:
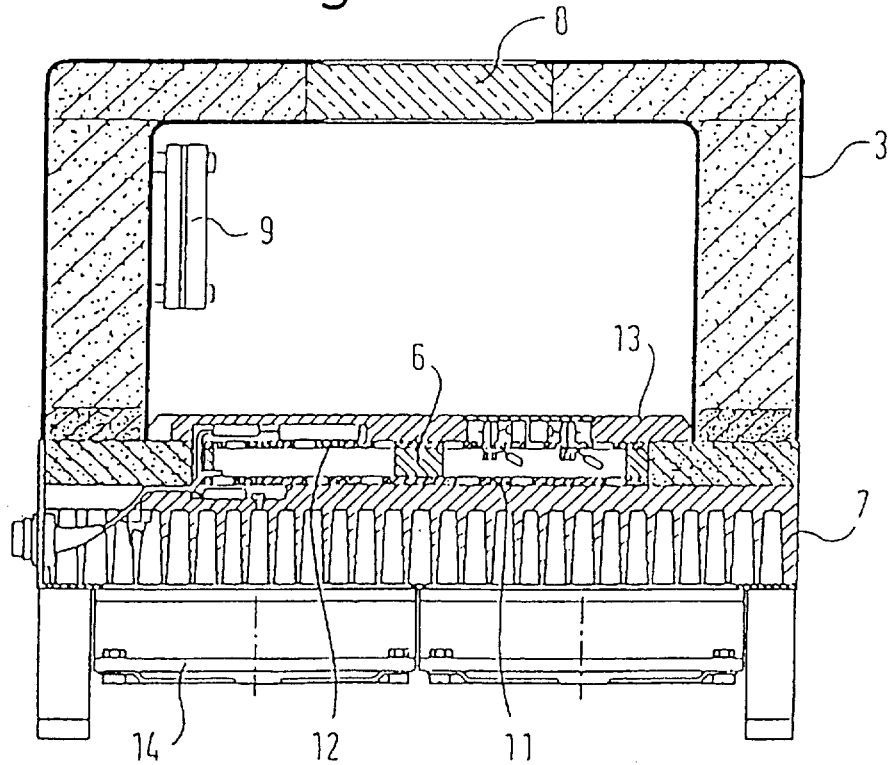
FIG. 11 is a sectional view of a Peltier heating and cooling chamber according to a first tested embodiment of the invention.

FIG. 11 is a sectional view of a Peltier heating and cooling chamber according to a first tested embodiment of the invention. The parts and assemblies, already described and referred to with reference to FIG. 3, will not be described once again. A viewing window 8 is provided on the upper side of the insulating shroud 3. The frame plate for the Peltier elements 1 and 2 is indicated by reference symbols 12 and 11, respectively. The actual temperature inside the heating/cooling chamber can be sensed by means of a calibrated temperature sensor 9 to enable exact regulation of the current to be supplied to the Peltier elements 1 and 2. Beneath the heat sink 7, between standing feet (not referred to any more precisely), are, in the example, two flat axial fans 14, to insure adequate removal of the heat loss if required.

FIGS. 12 and 13 are longitudinal and transverse sectional views, respectively, of a second tested embodiment of a Peltier heating and cooling chamber in accordance with the invention. In the case of the embodiment of a heating and cooling chamber according to the invention as shown in those figures, the air-flow cooling through the heat sink 7 (with assistance, if appropriate, of the axial fans 14) is replaced by a water cooling device 15 or a compressor cooling device of lower capacity.

In the case of a layer arrangement with closely toleranced mutual adaptation, the overlapping area of the intermediate plate 6 and a special selection and arrangement of lower power Peltier elements 1 on the one hand and higher power Peltier elements 2 on the other hand, the device according to the invention can be operated over a significantly greater temperature range of, for example, −15° to +95° C. (air-cooled) or −40° to +95° C. (water-cooled). This was hitherto unknown for comparable cooling/heating devices of this type.

Thus it is seen that the present invention provides a thermoelectric heating and cooling chamber characterized by a large adjustable temperature range. By utilizing the teachings of the invention, one can achieve an enlarged temperature range without incurring an unacceptably large outlay for power dissipitation loss.

While this invention has been described with reference to its presently-preferred embodiment, it is not so limited in scope. Rather, the present invention is only limited insofar as it is defined in the following set of patent claims and includes within its scope all equivalents thereof.

What is claimed is:

1. In a thermoelectric device of the type that includes a plurality of Peltier elements in the region of a base area, said elements being connected one behind the other in cascade arrangement and distributed in a heating and cooling area, and further including a heat-dissipating means located on an outer surface, said Peltier elements being subdivided into two groups of different power stages and arranged in two mutually parallel layers so that the Peltier elements of lower power form a first, inner heating and cooling area and the Peltier elements of higher power form a second, outer heating and cooling area, and in which the Peltier elements of higher power are covered by said heat-dissipating means, the improvement comprising, in combination:

a) said thermoelectric device being installed within a heating/cooling chamber with heat insulation; and b) at least one of said Peltier elements of higher power being electrically bypassed by means of a bypass diode polarized so that, during heating operation, no electric current flows through said at least one bypassed Peltier element.

2. A thermoelectric device as defined in claim 1 further characterized in that said bypass diode is arranged to electrically bypass all of said Peltier elements of higher power connected in cascade.

3. A thermoelectric device as defined in claim 1 wherein:

a) at least one of said Peltier elements of higher power is electrically bypassed; and b) a bypass diode is individually associated with respect to each of said at least one bypassed Peltier elements.

4. A thermoelectric device as defined in claim 3 wherein each of said at least one bypass diodes is integrated with the associated Peltier element.

\* \* \* \* \*